United States Patent [19]

Ringer et al.

[11] Patent Number: 5,408,386

[45] Date of Patent: Apr. 18, 1995

[54] SOCKET ASSEMBLY INCLUDING A FIRST CIRCUIT BOARD LOCATED BETWEEN A RECEPTACLE HOUSING AND A SECOND CIRCUIT BOARD

[75] Inventors: William V. Ringer, El Dorado Hills; Homer T. Gee, Roseville, both of Calif.

[73] Assignee: Intel Corporation, Santa Clara, Calif.

[21] Appl. No.: 188,590

[22] Filed: Jan. 27, 1994

Related U.S. Application Data

[63] Continuation of Ser. No. 969,561, Oct. 30, 1992, abandoned.

[51] Int. Cl.⁶ .............................................. H01R 23/68
[52] U.S. Cl. ................................ 361/785; 361/784; 361/737; 439/44
[58] Field of Search ............. 361/785, 728, 729, 730, 361/733; 439/44, 60, 61, 62, 65, 68, 74, 76, 928

[56] References Cited

U.S. PATENT DOCUMENTS 4,603,320  7/1986  Farago ...................... 361/730

Primary Examiner—Leo P. Picard
Assistant Examiner—Donald A. Sparks
Attorney, Agent, or Firm—Blakely, Sokoloff, Taylor & Zafman

[57] ABSTRACT

A unit for providing a socket for a plurality of removably mountable peripheral devices to a computer including a receptacle for receiving the body of such removably mountable peripheral devices, the receptacle being generally block shaped and having a pair of generally-parallel generally-rectangular outer surfaces separated by a distance which is small compared to dimensions of the rectangular surfaces, the receptacle including conductors for electrically connecting to any such removably mountable peripheral devices and being designed to fit within the interior of a computer; a first circuit board having a generally-rectangular shape; interface circuitry for effecting a connection of such removably mountable peripheral devices to a bus of a computer within which the unit is positioned, the interface circuitry being mounted on the first circuit board and having electrical connections on the surface of the first circuit board to the receptacle, the first circuit board being mounted to the receptacle; a second circuit board; electrical conductors on the surface of the second circuit board connected to the bus; and connections between terminals of elements of the interface circuitry and the conductors on the second circuit board so that the first circuit board lies between the receptacle and the second circuit board.

18 Claims, 3 Drawing Sheets

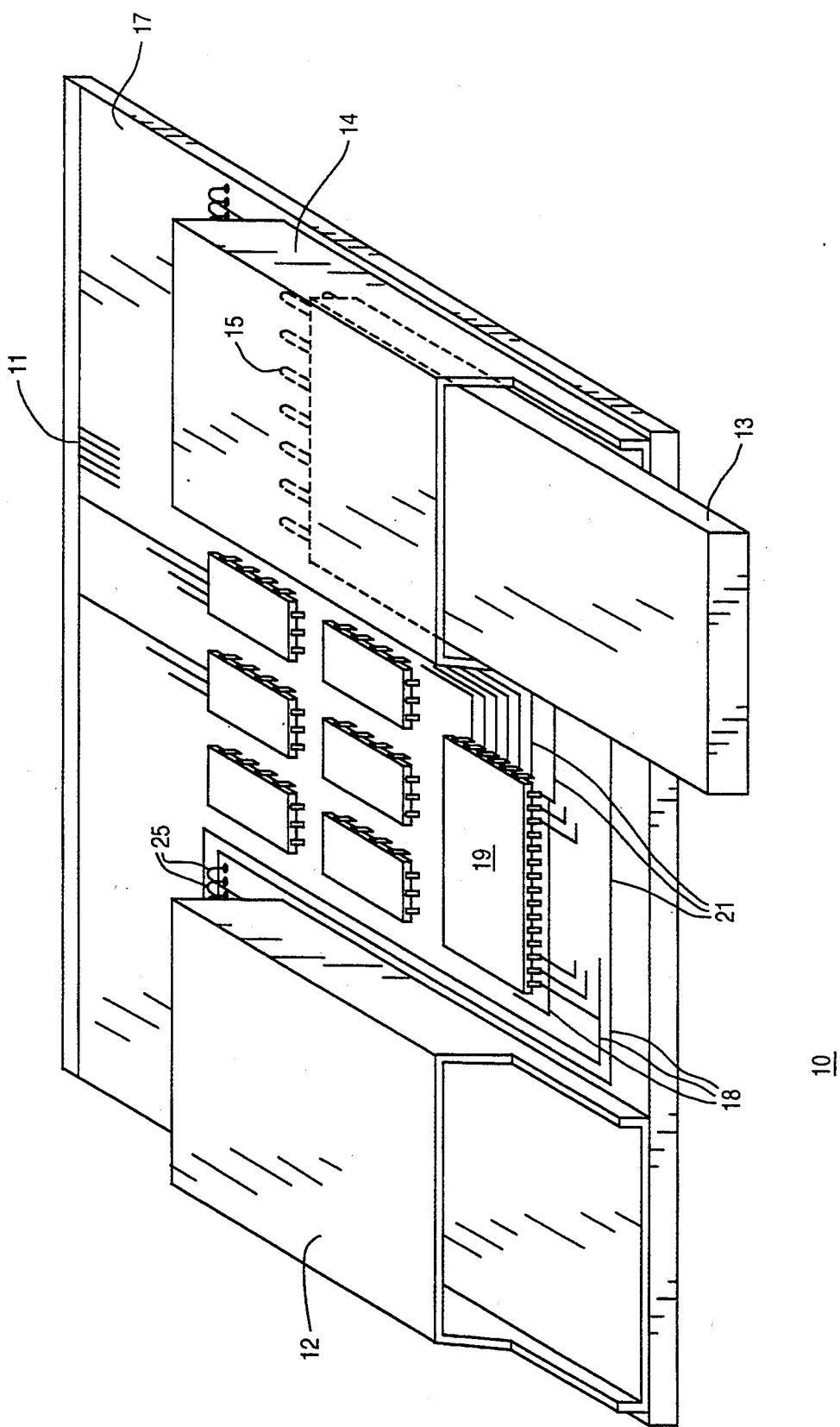
FIG_1 (PRIOR ART)

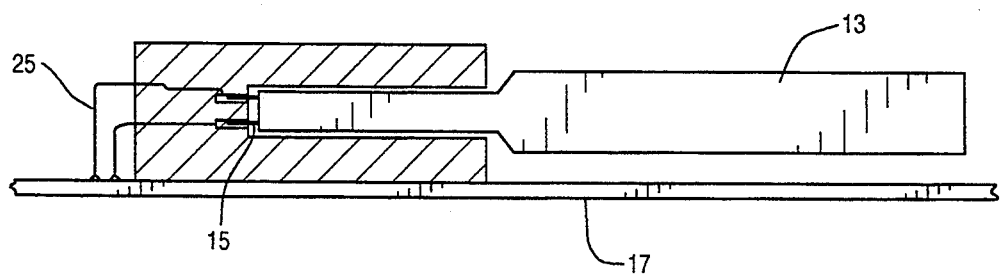
FIG_2 (PRIOR ART)
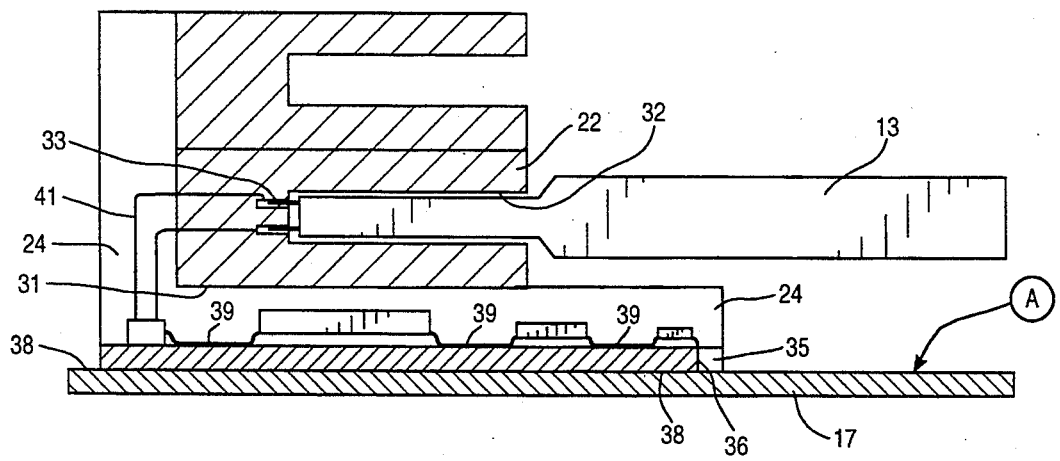
FIG_4

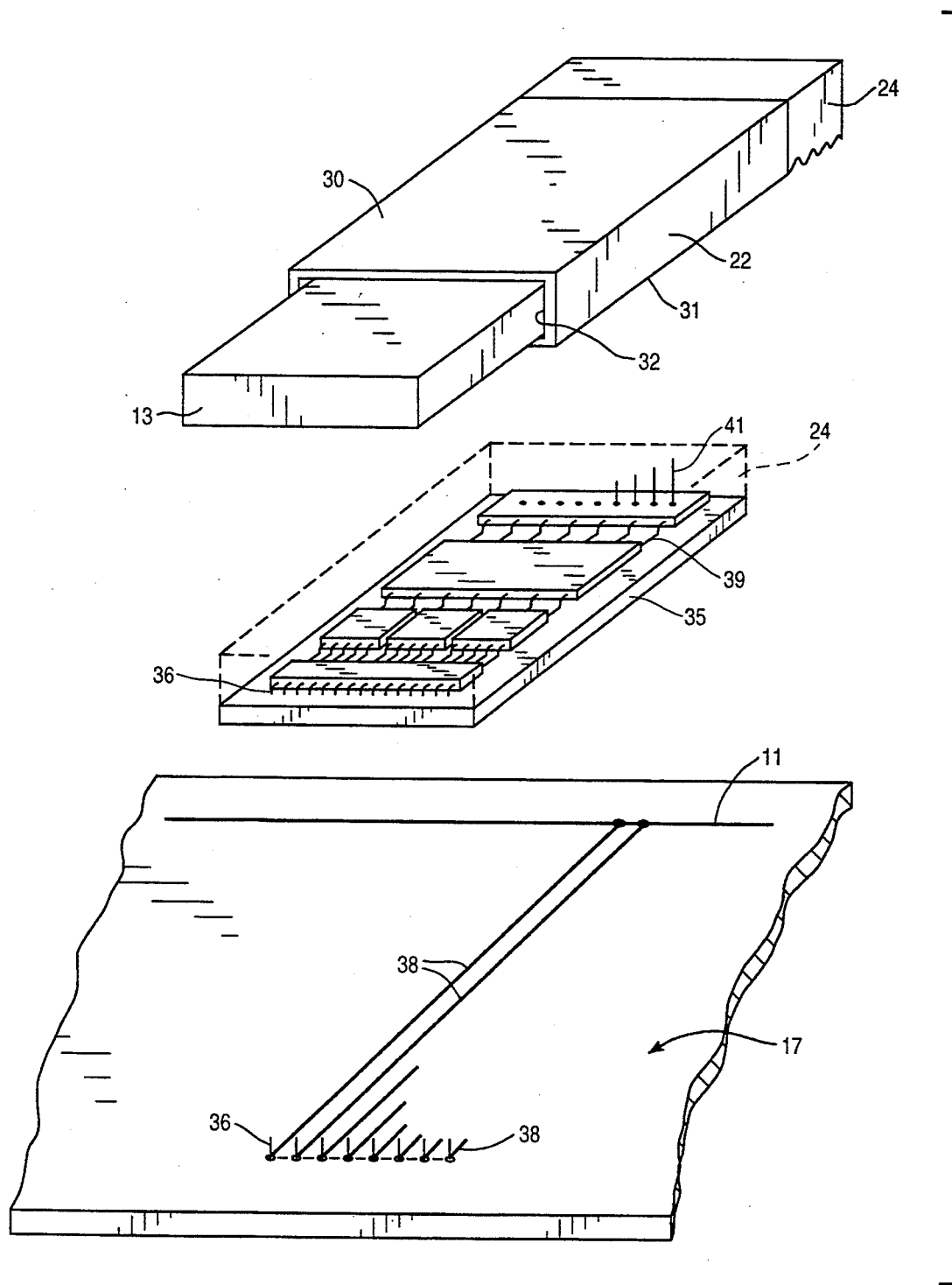
FIG_3

SOCKET ASSEMBLY INCLUDING A FIRST CIRCUIT BOARD LOCATED BETWEEN A RECEPTACLE HOUSING AND A SECOND CIRCUIT BOARD

This application is a continuation of U.S. application Ser. No. 07/969,561, filed Oct. 30, 1992, now abandoned.

BACKGROUND OF THE INVENTION

1. Field of the Invention

This invention relates to connectors on printed circuit boards and, more particularly, to apparatus providing a socket for a number of removable peripheral devices including both memory devices and input output devices.

2. History of the Prior Art

One of the most rapidly growing markets for computer systems is the portable computer market. In the last few years, portable computers have become more and more powerful while at the same time they have become smaller and lighter. As a part of this changing market, the various components of which a computer is constructed have become smaller and lighter while their ability to handle more and more data has increased. An important way in which this has been accomplished has been the reduction in physical size with the increase in data handling capacity of electromechanical hard disk drives (hereinafter referred to as rotating hard drives). Such rotating hard drives are very useful and have become almost a necessity to the operation of personal computers, especially portable computers.

However, such rotating hard drives do have their drawbacks. They are relatively heavy and increase the weight of a computer, especially a portable computer, significantly. Rotating hard drives draw a substantial amount of electrical power. In a portable computer this power is provided by batteries with limited operational lives. More importantly, rotating hard drives are very susceptible to shock. A rotating hard drive in a portable computer which is dropped is quite likely to cease functioning with a catastrophic loss of data.

Recently, other forms of data storage devices have begun to replace rotating hard drives in portable computers. For example, flat memory cards (about the size of a credit card) mounting an array of memory devices such as EPROM, EEPROM, SRAM, or flash EEPROM memory devices have been used as fixed storage for application programs. Such flat "solid state disks" supplement or eliminate the need for a portable computer to access a rotating hard drive during operation of the program. This makes the program run faster. Such solid state disks are light in weight and occupy very little space. More importantly, they are especially rugged and will withstand repeated drops each of which would destroy a typical rotating hard drive. If the rotating hard drive is eliminated, the portable computer is much more tolerant of shock. A flat memory card carrying data or an application program is typically connected to the computer through a socketing arrangement which protects the card and allows cards carrying different application programs or data to be interchanged with one another. One such memory card is described in U.S. patent application Ser. No. 07/861,013, entitled *A FLASH MEMORY CARD WITH A READ/BUSY MASK REGISTER AND A READY/BUSY MODE REGISTER*, Robinson et al, filed Mar. 31, 1992, and assigned to the assignee of the present invention.

Another group of devices which is especially important to portable computers includes peripheral input/output devices such as modems, facsimile machines, or local area networks. A modem, for example, allows a user of a portable computer to correspond with other computers using the telephone lines. It provides access to all of the data available at a base office without the need to store that data in a portable computer. Consequently, the reduction in size of modems has proceeded at the same pace as has the reduction in size of hard disks. Typically, the electronics of a modem are arranged on an internal board within the computer. Some arrangements provide a separate portable modem which may be carried along and connected to a portable computer when needed. Some modems have been designed recently which plug into sockets recessed within the body of a portable computer.

Historically, each of the aforementioned useful peripheral devices has required its own interface circuitry for connecting to the internal circuitry of a portable computer. This required both interface circuitry and a socket for each device. Of late, apparatus has been devised which allows some of these various forms of computer components to be plugged into the same socket of a computer thereby reducing the space needed within the portable computer. For example, an international standard which defines the physical and electrical interface specifications for the interchangeability of memory and input/output cards was introduced by Personal Computer Memory Card International Association (PCMCIA) jointly with the Japanese Electrical Industry Association (JEIDA) in September 1991. In addition, a specification referred to as an Exchangeable Card Architecture (ExCA) Specification, Dec. 20, 1991, has been issued by Intel Corporation of Santa Clara, Calif. This document describes specifications which manufacturers may use for devising interfaces which meet the requirements for insuring the interchangeability of memory and input/output cards for portable personal computers of different manufacturers. A socket designed to these specifications allows cards such as a modem and a flash memory to be attached, used, and removed interchangeably in the same socket. Such apparatus includes at least one socket recessed into the computer so that the devices connected are protected by the body of the computer and interface circuitry for each of the components to be connected. This new apparatus has offered a great increase in the usefulness of a typical portable computer. Unfortunately, the circuitry and hardware needed to allow this multiple use of the socket is larger than desirable and takes up a great deal of space within a portable computer. It is very desirable that the size of this space be reduced.

SUMMARY OF THE INVENTION

It is, therefore, an object of the present invention to provide circuitry and apparatus for reducing the size of circuitry and apparatus used for mounting removable components within a computer.

It is another object of the present invention to reduce the space needed for mounting removable components within a portable computer.

These and other objects of the present invention are realized in a unit for providing a socket for a plurality of removably mountable peripheral devices to a computer comprising a receptacle for receiving the body of such removably mountable peripheral devices, the receptacle being generally block shaped and having a pair of generally-parallel generally-rectangular outer surfaces separated by a distance which is small compared to dimensions of the rectangular surfaces, the receptacle including means for electrically connecting to any such removably mountable peripheral devices and being designed to fit within the interior of a computer; a first circuit board having a generally-rectangular shape; interface circuit means for effecting a connection of such removably mountable peripheral devices to a bus of a computer within which the unit is positioned, the interface circuit means being mounted on the first circuit board and having electrical connections on the surface of the first circuit board to the means for electrically connecting to any such removably mountable peripheral devices of the receptacle, the first circuit board being mounted to the receptacle; a second circuit board; electrical conductors on the surface of the second circuit board connected to the bus; and means for connecting terminals of elements of the interface circuit means to the conductors on the second circuit board so that the first circuit board lies between the receptacle and the second circuit board.

These and other objects and features of the invention will be better understood by reference to the detailed description which follows taken together with the drawings in which like elements are referred to by like designations throughout the several views.

BRIEF DESCRIPTION OF THE DRAWINGS

FIG. 1 is a perspective diagram illustrating a prior art physical arrangement providing a socket for connecting a plurality of different components to a portable computer.

FIG. 2 is a cross-sectional side view of the arrangement of FIG. 1 for providing a socket for connecting peripheral components to a portable computer.

FIG. 3 is an exploded perspective diagram illustrating an arrangement in accordance with the present invention for providing a socket for connecting a plurality of different components to a portable computer.

FIG. 4 is a cross-sectional side view of a portion of the arrangement of the present invention shown in FIG. 3 for providing a socket for connecting a plurality of different components to a portable computer.

DETAILED DESCRIPTION

Referring now to FIG. 1, there is shown a perspective view of the socketing arrangement 10 provided by the prior art for connecting a pair of component devices such as a modem card and a flash memory array card to a computer. Typically such a connection is made to a portable computer because of the need to reduce both the weight and size of such portable computers. However, it will be understood by those skilled in the art that the socketing arrangement 10 might also be utilized in other computers or devices.

As will be appreciated, the types of devices which are connected to such a socketing arrangements are quite varied; as was outlined above, long term storage devices such as flash memory and modems are connected to computers using socketing arrangements. Each of the peripheral components which may be connected by the socketing arrangement is typically connected to a system bus of the computer.

Historically, each of these devices has been connected to the bus through a different type of interface. For example, the flash memory arrays are designed to replace rotating hard drives and may be joined to a bus through number of different industry standard interfaces originally devised for such rotating hard drives. On the other hand, modems and other peripheral devices are normally arranged to be connected to the bus through various other input/output interfaces. Consequently, the design of an interface which would function with the different types of devices required substantial ingenuity and a substantial investment in time and money.

As may be seen, the socketing arrangement includes a first socket 12 and a second socket 14 each of which is mounted over a stable platform 17 (typically a circuit board). Although the arrangement describes two sockets used to connect two peripheral components, the invention may as easily be used with any number of sockets from one up, whatever may be physically practical for the particular electronic device with which it is used. Two sockets allow two different peripheral devices to be utilized at once. The sockets 12 and 14 may be of any type adapted to fit the peripheral devices but are generally chosen to meet the dimensions provided by a JEIDA 4.1/PCMCIA 2.0 standard specification. As such they provide a channel into which a card 13 with projecting terminals 15 may fit. The card 13 has mounted on it the circuitry for carrying out the functions of the particular peripheral device being connected to the computer. The terminals 15 are adapted to electrically connect the peripheral device 13 to conductors 25 at the rear of the sockets 12 and 14 which provide contact to the board 17. This is best illustrated in the cross-sectional view of FIG. 2.

Between the two sockets 12 and 14 are arranged various electronic circuit elements which are adapted to provide the interface with the system bus of the portable computer with which the socketing arrangement is to be used. It should be noted that for the purpose of the present invention, the particular interface circuitry is not important although the fact that the circuitry is connected between the terminals of the socketing arrangement and the computer bus is important. As may be seen, in the arrangement 10 illustrated, a number of individual chips are mounted on a the circuit board 17. The board 17 carries a number of conductors which are generally referred to here as 18. These conductors 18 provide connection between the elements of the individual components mounted on the circuit board 17 and a number of connectors 25 which are arranged to connect to the flat cards 13 when they are placed in the sockets 12 and 14. Various other conductors 26 connect the elements of the interface circuitry together. In addition, a set of conductors 21 connect the interface circuitry to a bus 11 of the computer which is illustrated by a single large conductor at the upper portion of the board 17 in FIG. 1. The conductors 18, 26, and 21 and the individual chips are arranged to provide a combinational interface Lapable of allowing connection of modems, flash memory storage, and other peripheral devices to the system bus of the computer in which the arrangement 10 is positioned.

Typically, the board 17 upon which the individual computer chips are mounted is the mother board of a portable computer; and, consequently, the space available for circuitry is very limited. The area occupied by each of the two sockets 12 and 14 is very substantial relative to the entire area of the board 17. Moreover, the areas on the circuit board 17 occupied by the interface circuitry including the conductors 18, 26, and 21 which connect the peripheral components to the bus 11 to allow the components to function is also relatively substantial. In one embodiment, the interface circuitry and the sockets occupy a total surface area of the board 17 of approximately four by six inches.

It has been discovered that by mounting the interface circuitry which controls the sockets 12 and 14 as a part of a single package unit which includes the interface circuitry and the sockets themselves, a substantial reduction in the area of the board 17 occupied by that interface circuitry may be obtained. Moreover, the amount of additional space required for the conductors 21 connecting the interface circuitry to the bus 11 may be reduced to a minimum so that a substantial area of the board 17 is freed for use by other elements. This elimination of most of the conductors on the board 17 is accomplished by designing a separate miniature circuit board which is mechanically fixed to the broadest face of one of the sockets and which carries the components of the interface circuitry. In one embodiment, the conductors and the circuit elements of the interface circuitry fixed to the miniature circuit board are embedded in a material such as epoxy and fixed under the housing of one of the sockets designed in accordance with the present invention. As will be seen, such a procedure allows the length of certain other conductors to be shortened substantially and reduces many of the problems caused in micro circuitry by long conductors.

FIGS. 3 and 4 illustrate an arrangement in accordance with the present invention by which the sockets and the circuitry used for providing the interface for those sockets may be implemented. As is illustrated in FIGS. 3 and 4, a socket 22 is mounted above a portion of the mother board 17. The socket 22 is of a shape adapted to receive a plurality of removably mountable peripheral devices which may be used with a computer. The socket 22 includes a receptacle portion 32 for receiving the body of any of such removably mountable peripheral devices 13. The receptacle 32 is generally block shaped and has a pair of generally-rectangular outer surfaces 30 and 31 generally-parallel to one another. These outer surfaces are separated by a distance which is small compared to dimensions of the rectangular outer surfaces. The receptacle 32 includes internal connectors 33 at one end for electrically connecting to any such removably mountable peripheral devices. The dimensions of one embodiment of the invention meet the JEIDA/PCMCIA criteria for flat peripheral devices. The unit is designed to fit within the interior of a computer. As is shown in the FIG. 4, a second socket 40 may be mounted to the socket 22 and above that socket 22 to utilize the same interface circuitry.

Embedded in a casing 24 lying against and mounted to the socket 22 are those circuit elements which constitute the circuitry mounted directly to the circuit board 17 in the prior art arrangement shown in FIG. 1. This interface circuitry is adapted to provide a connection between such removably mountable peripheral devices and a bus within the computer in which the unit is positioned. The interface circuitry includes a miniature circuit board 35 having a rectangular shape such that it fits under the lower rectangular surface of the socket receptacle 32. The board 35 has a surface area less than the area of the board 17 covered by a single socket receptacle and a projecting board 13 in the arrangement of FIG. 1.

The circuit board 35 is joined to the receptacle 32, and the interface circuitry is mounted on the circuit board 35. This interface circuitry includes conductors 39 joining the elements of that circuitry and conductors 41 connecting to the connectors 33 in the sockets 22. The interface circuitry and the circuit board 35 may be embedded in a protective material such as an epoxy well known to those skilled in the art so that it has the same general shape as the receptacle. This package is arranged to lie against the receptacle 32 and is mounted thereto by any well known mounting arrangement. In fact, the protective epoxy used to form the casing 24 illustrated may surround portions of the receptacle to provide for joining the board 35 and the receptacle 32. This arrangement of the interface circuitry and the sockets reduces the area required within a computer for the socketing unit.

As may be seen from FIG. 3, this allows the conductors 41 which connect the circuit elements of the interface circuitry to the socket 22 and those conductors 39 connecting the interface circuit elements together to be embedded in the protective epoxy casing 24 so that both the conductors and the interface elements are protected from damage due to positioning and removal of the devices 13. Placing these conductors in the casing 24 on the board 35 positioned under the socket housing allows the length of the conductors which connect the interface circuit elements to the bus 11 to be shortened substantially, eliminating a substantial amount of the resistance and inductance of those conductors. This is accomplished by placing the conductors 38 which connect the circuit elements of the interface circuitry to the bus 11 on the main circuit board 17 below the board 35. The terminals 36 from the interface circuit elements protrude directly through the board 35 and directly contact conductors 38 on the board 17 which join to the bus 11. These conductors run straight, directly from the terminals of the interface circuit to the bus 11.

As may be seen in FIG. 1, the connectors 18 are shown extending from a chip 19 toward the lower portion of the figure, then at right angles toward the side of the socket 12. These conductors 18 continue upward (as shown in the figure) alongside the socket 12 to join the connectors 25 at the upper end of the socket 12. Similarly, conductors 21 which join the circuit elements to the bus 11 in FIG. 1 must take a convoluted path to the bus 11 because of the various circuit elements and the other conductors on the board. By positioning all of the circuit elements, their interconnections, and the conductors on the circuit board 35 joining to the socket 22, the conductors 38 on the board 17 are free to run directly from the terminals 36 to the bus 11. Thus, these conductors 38 are designed without the convolution necessary for the conductors leading to the bus in FIG. 1. Thus, a conductor 38 shown in FIG. 3 which accomplishes the same function as the conductor 21 follows the path illustrated in FIG. 3. As may be seen, this eliminates almost all the lengths of conductors to the bus in the horizontal dimension and some substantial portion of the vertical lengths of these conductors necessary because of a reversal of direction.

More importantly, when the interface circuitry is removed from the mother board 17, a substantial area of the mother board is freed for use by other components of the computer with which the sockets are associated. For example, if a pair of sockets are arranged in the same casing mounted closely adjacent one another as is shown in the expanded view of FIG. 3, the entire socketing arrangement, the circuitry which controls the interface with the sockets, and the conductors connecting the sockets and the circuitry use an area on the board which is substantially less than that required for the arrangement illustrated in FIG. 1.

As is also illustrated in FIG. 4 which shows a cross-section of a portion of the arrangement of FIG. 3, even though the socket 22 is raised somewhat higher off the mother board to allow other circuit elements to be embedded thereunder, an amount of space is left at A on the mother board under the unified socket arrangement in which other circuit elements not necessarily related to the sockets may be mounted. Thus, the use of the arrangement of the present invention in fact releases even more of the mother board area for use than might be expected.

In order to provide an arrangement in accordance with the present invention, a separate miniature circuit board is chosen from any of the number of materials available to those skilled in the art for that purpose. The various conductors are arranged in position on the board to effect the appropriate connections to the terminals of the sockets, and the electrical components are joined to the board. State of the art miniaturization techniques such as die-on-board, chip-on-flex, and other techniques may be used by those skilled in the art to place the components on the board 35. The miniature board and the elements and conductors thereon are then encased in a compound such as one of the epoxies known to those skilled in the art so that the miniature board is physically joined to the socket or sockets. Additional mechanical apparatus known to those skilled in the art for joining the board and socket may be used. The conductors from the interface to the bus are placed on the board 17. The entire socket arrangement is then in condition to be arranged in position on the board 17 within a portable computer or other device to receive the various removable peripheral components which it is adapted to accept.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. Apparatus for providing a socket for a plurality of removably mountable peripheral card devices to a computer, said apparatus comprising:

(a) a receptacle for receiving the body of such removably mountable peripheral card devices,
        the receptacle having a housing for surrounding at least a portion of the removably mountable peripheral card device so as to support the removably mountable peripheral card device, the housing including an outer surface,
        the receptacle including means for electrically connecting to any such removably mountable peripheral card devices and being designed to fit within the interior of a computer;
    (b) a first circuit board;
    (c) interface circuit means for effecting a connection of such removably mountable peripheral card devices to a bus of a computer,
        the interface circuit means being mounted on the first circuit board and having electrical connections on the surface of the first circuit board to the means for electrically connecting to any such removably mountable peripheral card devices of the receptacle,
        the first circuit board being mounted parallel to, beneath, and in support of the outer surface of the housing of the receptacle, wherein the first circuit board lies beneath the removably mountable peripheral card device when inserted into the receptacle;
    (d) a casing for protecting said interface circuit means and for supporting said receptacle, at least a portion of said casing being positioned between the first circuit board and the receptacle, said casing being positioned in relation to the first circuit board such that at least a portion of the interface circuit means of the first circuit board is embedded in said casing;
    (e) a second circuit board;
    (f) electrical conductors on the surface of the second circuit board connected to the bus; and
    (g) means for connecting terminals of elements of the interface circuit means to the conductors on the second circuit board.

2. Apparatus for providing a socket for a plurality of removably mountable peripheral card devices as claimed in claim 1 in which the first circuit board has less area than the outer surface of the receptacle whereby additional area is provided for devices on the second circuit board between the second circuit board and the outer surface of the receptacle.

3. Apparatus for providing a socket for a plurality of removably mountable peripheral card devices as claimed in claim 1 further comprising a second receptacle mounted to the first receptacle.

4. Apparatus for providing a socket for a plurality of removably mountable peripheral card devices as claimed in claim 1 in which the first circuit board has less area than a unified socket arrangement consisting of the socket and any such removably mountable peripheral card device inserted into the socket, whereby additional area is provided for devices on the second circuit board between the second circuit board and the unified socket arrangement.

5. The apparatus for providing a socket for a plurality of removably mountable peripheral card devices to a computer as claimed in claim 1, wherein at least one of said plurality of removably mountable peripheral card devices is a PCMCIA card.

6. The apparatus for providing a socket for a plurality of removably mountable peripheral card devices to a computer as claimed in claim 1, wherein the electrical conductors on the surface of the second circuit board are located entirely within a lateral area on the second circuit board defined by a width of the receptacle.

7. An apparatus for providing a socket for mounting a plurality of removably mountable peripheral card devices to a computer, said apparatus comprising:

(a) a receptacle for receiving and supporting the body of one of said removably mountable peripheral card devices, said receptacle being designed to fit within the interior of said computer, said receptacle including:
        (i) a pair of rectangular outer surfaces; and
        (ii) a rear surface comprising connectors capable of electrical connection to said removably mountable peripheral card device upon insertion of said removably mountable peripheral card device into said receptacle;

wherein said receptacle is capable of receiving, supporting, and surrounding at least a portion of said removably mountable peripheral card device upon insertion of said removably mountable peripheral card device into said receptacle such that said removably mountable peripheral card device is supported by said receptacle;

(b) a first circuit board positioned parallel to, in support of, and beneath one of said pair of rectangular outer surfaces of said receptacle, said first circuit board comprising an interface circuit, said interface circuit being coupled to said connectors of said receptacle, said interface circuit being capable of effecting a communication between said removably mountable peripheral card device and a bus of said computer;

(c) a casing for protecting said interface circuit and supporting said receptacle, at least a portion of said casing being positioned between said first circuit board and said receptacle, said casing being positioned in relation to said first circuit board such that at least a portion of said interface circuit of said first circuit board is embedded in said casing; and (d) a second circuit board, said first circuit board being mounted on said second circuit board such that said first circuit board lies between said receptacle and said second circuit board, said second circuit board comprising electrical conductors coupled to said bus of said computer and to said interface circuit of said first circuit board.

8. The apparatus for providing a socket for mounting a plurality of removably mountable peripheral card devices to a computer as claimed in claim 7, wherein said one of said removably mountable peripheral card devices is a PCMCIA card.

9. The apparatus for providing a socket for mounting a plurality of removably mountable peripheral card devices to a computer as claimed in claim 7, wherein said first circuit board has less area than a unified socket arrangement consisting of the socket and any such removably mountable peripheral card device inserted into the socket, whereby additional area is provided for devices on the second circuit board between the second circuit board and the unified socket arrangement.

10. The apparatus for providing a socket for mounting a plurality of removably mountable peripheral card devices to a computer as claimed in claim 7, further comprising a second receptacle mounted to said first receptacle.

11. For use in a data processing system, an apparatus for supporting a peripheral card and for electrically connecting the peripheral card to a bus, the apparatus comprising:

(a) a first circuit board having first electrical conductors for electrical connection to a bus;

(b) a circuit board package mounted over the first circuit board, the circuit board package including:
 (i) a second circuit board, and
 (ii) interface circuitry mounted on the second circuit board and configured for electrical connection to the first electrical conductors;

(c) a housing mounted over the circuit board package such that the housing is supported by the circuit board package, the housing having a receptacle mounted over at least a portion of the circuit board package, the receptacle for receiving and supporting the peripheral card over at least a portion of the circuit board package, the housing including connectors configured with the receptacle for electrical connection to the peripheral card while the peripheral card is supported in the receptacle; and (d) second electrical conductors coupled to the interface circuitry and to the connectors of the housing for electrically connecting the peripheral card to the interface circuitry.

12. The apparatus of claim 11, wherein the peripheral card is a PCMCIA card.

13. The apparatus of claim 11, wherein the circuit board package includes a casing having epoxy for embedding the interface circuitry.

14. The apparatus of claim 11, wherein the interface circuitry includes terminals coupled to the first electrical conductors through the second circuit board.

15. The apparatus of claim 11, wherein the circuit board package is mounted over at least one of the first electrical conductors of the first circuit board.

16. The apparatus of claim 11, wherein the second circuit board covers a first area of the first circuit board, the housing together with the peripheral card supported in the receptacle of the housing cover a second area of the first circuit board, and the first area is less than the second area.

17. The apparatus of claim 11, wherein the housing is a first housing, the apparatus comprising:

(e) a second housing mounted over at least a portion of the first housing, the second housing having a receptacle for receiving and supporting another peripheral card.

18. The apparatus of claim 11, wherein the housing includes an outer surface directly mounted to the circuit board package.

* * * * *